United States Patent
Kim et al.

(10) Patent No.: US 7,301,207 B2
(45) Date of Patent: Nov. 27, 2007

(54) SEMICONDUCTOR DEVICE CAPABLE OF THRESHOLD VOLTAGE ADJUSTMENT BY APPLYING AN EXTERNAL VOLTAGE

(75) Inventors: Yil Wook Kim, Seoul (KR); Jun Hee Cho, Seoul (KR); Sung Eon Park, Seoul (KR); Jin Hong Ahn, Kyoungki-do (KR); Sang Don Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 403 days.

(21) Appl. No.: 11/008,363

(22) Filed: Dec. 9, 2004

(65) Prior Publication Data

US 2005/0280113 A1 Dec. 22, 2005

(30) Foreign Application Priority Data

Jun. 21, 2004 (KR) .................. 10-2004-0046316

(51) Int. Cl.
*H01L 29/76* (2006.01)
(52) U.S. Cl. .................. 257/374; 257/506; 257/508; 257/E29.02
(58) Field of Classification Search ........... 257/374, 257/501, 506, 508, 522, E29.02; 438/221
See application file for complete search history.

(56) References Cited

U.S. PATENT DOCUMENTS 5,373,180 A * 12/1994 Hillenius et al. .......... 257/357
6,124,177 A 9/2000 Lin et al. ................ 438/305
6,245,636 B1 6/2001 Maszara .................. 438/411
6,475,841 B1 11/2002 Taylor, Jr. et al. ........ 438/197
6,784,076 B2 * 8/2004 Gonzalez et al. ......... 438/426
6,972,234 B1 * 12/2005 Madurawe et al. ....... 438/289
2007/0018328 A1 * 1/2007 Hierlemann et al. ...... 257/762

FOREIGN PATENT DOCUMENTS

| JP | 62-58658 | * 1/1989 | ............. 257/392 |
| TW | 332327 | 5/1998 | |
| TW | 457626 | 10/2001 | |
| TW | 536816 | 6/2003 | |

OTHER PUBLICATIONS

Notice of Allowance and Search Report from Taiwanese Intellectual Property Office.

* cited by examiner

*Primary Examiner*—T. N. Quach
(74) *Attorney, Agent, or Firm*—Ladas & Parry LLP

(57) ABSTRACT

A semiconductor device has a silicon substrate, in which an active region is formed between two device isolation films and a gate is formed on the surface of the active region. The silicon substrate has a laterally etched portion in the active region below the surface of the active region on the side near the device isolation film. An insulating film is formed on the laterally etched portion of the silicon substrate. A conductive electrode is formed on the insulating film, through which an external voltage is applied to adjust a threshold voltage. The device isolation film is formed on the conductive electrode. None or some pockets of vacant cavity is present between the device isolation film and the conductive electrode.

3 Claims, 5 Drawing Sheets

SEMICONDUCTOR DEVICE CAPABLE OF THRESHOLD VOLTAGE ADJUSTMENT BY APPLYING AN EXTERNAL VOLTAGE

BACKGROUND OF THE INVENTION

1. Field of the Invention

The present invention relates generally to a semiconductor device capable of adjusting the threshold voltage for optimal device operations, and more particularly to a semiconductor device capable of threshold voltage adjustment by applying an external voltage and a method for manufacturing the same by which a partial SOI structure is realized.

2. Description of the Prior Art

As generally known, a MOSFET in a semiconductor device operates sensitively in response to a threshold voltage (Vt). In order to obtain an optimal threshold voltage value of the MOSFET, issues relating to optimization of impurity implantation and/or thermal processes, and the like, are becoming important issues in the field of semiconductor manufacturing processes.

As semiconductor devices are miniaturized due to high-integration, more excessive impurity implantation is conventionally required in order to adjust the threshold voltage to an appropriate value. This excessive impurity implantation for purposes of adjusting the threshold voltage inevitably leads to deterioration of the device refresh characteristics and lowering of the device reliability due to the undesired dopant diffusion. Consequently, the conventional technique of excessively implanting impurity to adjust the threshold voltage does not lead to satisfactory results, especially for a highly integrated device.

Another conventional method applies a back bias to the body of a device for purposes of adjusting the threshold voltage. However, this conventional technique too has limitations, because the back bias will have less and less influence on the body as the semiconductor device size becomes small. In particular, since the channel and the body regions are surrounded by gates in a multiple gate structure (such as a double gate, a triple gate, or a surrounding gate structure) the back bias will have no influence on the body. The result is that it is impossible to adjust the threshold voltage by applying the back bias.

In conclusion, it is difficult to obtain an optimal threshold voltage in a highly integrated semiconductor device by applying the conventional techniques of the impurity implantation or thermal or other conventional processes. This presents challenges to securing optimal device characteristics coincident with the high integration of the semiconductor devices.

SUMMARY OF THE INVENTION

Accordingly, the present invention has been made to solve the above-mentioned problem occurring in the prior art, and an object of the present invention is to provide a semiconductor device and its manufacturing method, in which an appropriate threshold voltage can be obtained.

A further object of the present invention is to provide a semiconductor device and its manufacturing method, in which desired device characteristics can be secured by adjusting an appropriate threshold voltage.

In order to accomplish these objects, there is provided a semiconductor device in accordance with one aspect of the present invention, the semiconductor device comprising: a silicon substrate having a device isolation film for defining an active region; a gate being formed on the active region of the silicon substrate; and junction regions being formed on a substrate surface at both sides of the gate, wherein the silicon substrate includes a vacant space adjoining the device isolation film within the active region, and a surface of the vacant space is formed with a conductive electrode to which a voltage for adjusting the potential of a substrate body region is externally applied while an insulating film is interposed between the body region substrate and the conductive electrode.

In accordance with another aspect of the present invention, there is provided a method for manufacturing a semiconductor device, the method comprising the steps of: forming a pad oxide film and a pad nitride film on a silicon substrate having a device isolation region and an active region; etching the pad oxide film, the pad nitride film and the silicon substrate to form a trench in the device isolation region; forming an insulating film spacer on a trench sidewall including the etched pad oxide and nitride films; performing lateral etch from a silicon substrate portion of an exposed bottom surface of the trench toward the active region to form a vacant space within the active region of the silicon substrate; removing the insulating film spacer; forming a conductive electrode by interposing insulating film on a surface of the vacant space; filling up the trench with an oxide film to form a device isolation film; forming a gate on the silicon substrate; and forming junction regions on a substrate surface at both sides of the gate.

Preferably, the method for manufacturing a semiconductor device according to the present invention further comprises the step of performing heat treatment at a temperature of 800 to 1000° C. under a hydrogen atmosphere after the step of forming the insulating film spacer and before the step of forming the vacant space within the active region of the silicon substrate.

Also, it is preferred that the manufacturing method according to the present invention further comprises the step of performing field stop implantation onto the substrate surface of the exposed trench bottom surface after the step of forming the vacant space within the active region of the silicon substrate and before the step of removing the insulating film spacer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
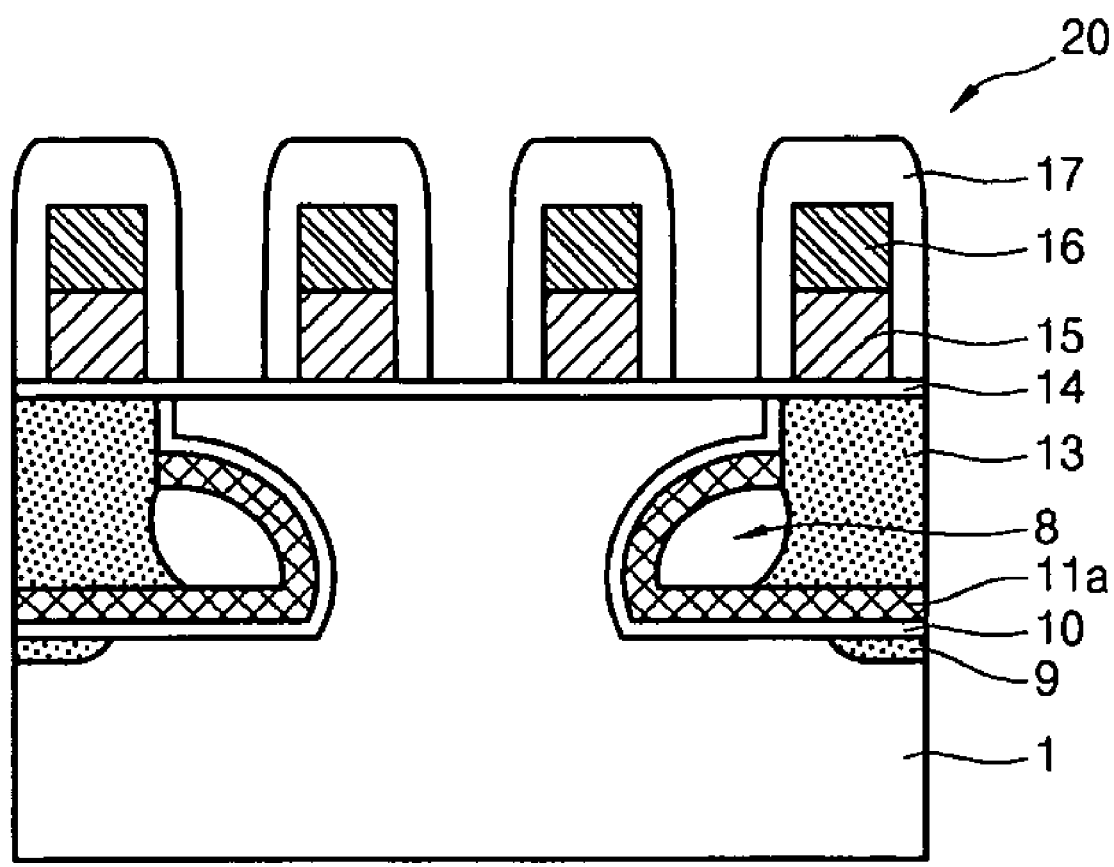
FIG. 1 shows a sectional view of a semiconductor device in accordance with a preferred embodiment of the present invention.

Hereinafter, a preferred embodiment of a semiconductor device and its manufacturing method according to the present invention will be described with reference to the accompanying drawings. In the following description and drawings, the same reference numerals are used to designate the same or similar components, and so repetition of the description on the same or similar components will be omitted.

In an embodiment of the present invention, a MOSFET exhibiting a SOI (Silicon on Insulator) characteristics is provided, in which an appropriate threshold voltage is obtained by, among other processes, depositing an electrode material to which an external voltage can be applied to adjust the threshold voltage. This technique of the present invention enables the potential of the body region to be adjusted directly by the external voltage applied to the deposited electrode material.

In particular, after a trench etching process, a lateral etch process is performed in a specific lateral direction to form a partial SOI structure. On the laterally etched surface, an insulating film and a conductive electrode are formed. The voltage is externally applied to the conductive electrode to adjust the potential of the body region, by which the threshold voltage of the MOSFET is adjusted.

These and other aspects of the present invention are explained in detail below.

As shown in FIG. 1, which is a sectional view of a semiconductor device formed according to a preferred embodiment of the present invention, the semiconductor device includes a silicon substrate 1 having a device isolation film 13 for defining an active region, a gate 20 formed on the silicon substrate 1, and junction regions (not shown) formed on a substrate surface at both sides of the gate 20. The active region i.e., the body region of the silicon substrate 1 is provided with a vacant space 8 adjoining the device isolation film 13 within the active region. The surface of the vacant space 8 is formed with an conductive electrode 11a to which a voltage for adjusting the potential of a substrate body region is externally applied while an insulating film 10 is interposed between the substrate body region and the conductive electrode 11a.

The potential of the body region and thus the threshold voltage are easily adjustable because the conductive electrode 11a adjoins the body region separated by the insulating film 10. As a result, the semiconductor device of the present invention is capable of operating at a high speed, which is a typical characteristic of a semiconductor device integrated in a SOI wafer, and the threshold voltage of the MOSFET can be adjusted very easily.

Now, a detailed description will be given for a method of manufacturing a semiconductor device in accordance with a preferred embodiment of the present invention with reference to FIGS. 2A to 2H.

Figure 2A:
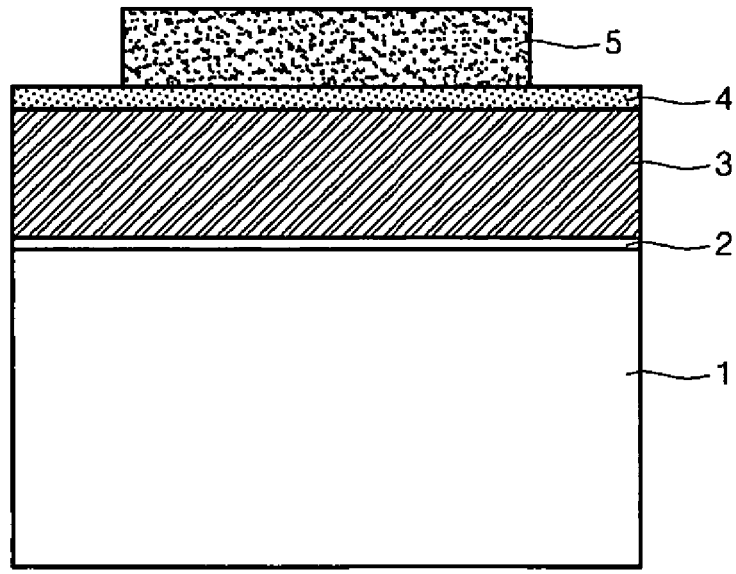
FIGS. 2A to 2H are sectional views according to the respective processes for explaining a method of manufacturing a semiconductor device in accordance with a preferred embodiment of the present invention.

Referring to FIG. 2A, a pad oxide film 2 and a pad nitride film 3 are formed on a silicon substrate 1 by, for example, a conventional STI (Shallow Trench Isolation) process. An organic anti-reflection film 4 is formed on the pad nitride film 3. Thereafter, a photoresist film pattern 5 exposing the device isolation region is formed on the anti-reflection film 4 by, for example, successive applications of coating, exposing, and development processes of photoresist film. Polymers such as COMA (Cycloolefin-Maleic Anhydride) or acrylate series may be used in forming the photosensitive film.

Figure 2B:
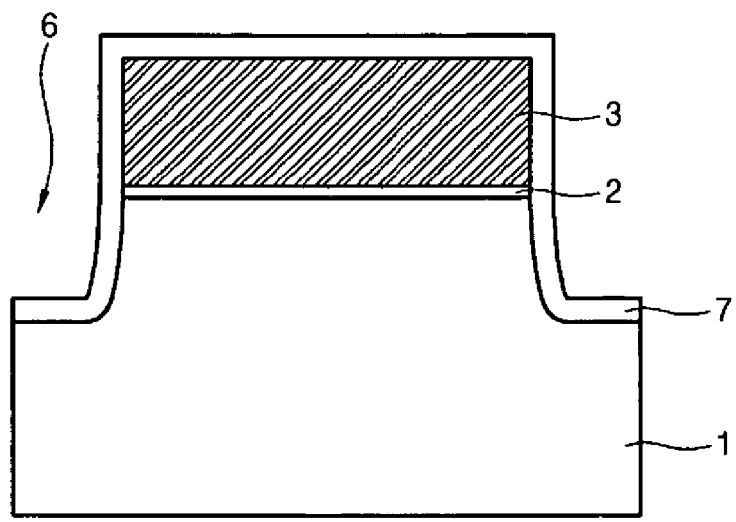

In the exposed portion of the anti-reflection film 4 in the device isolation region, the pad oxide and nitride films thereunder and the silicon substrate 1 are successively etched using the photoresist film pattern 5 as an etch barrier to form a trench 6 now referring to FIG. 2B. An insulating film 7 for a spacer is then deposited on the resultant substrate having the trench 6.

In forming the trench 6, a gas mixture of $CF_4/CHF_3/O_2$ may be used to etch the pad oxide film 2 and the nitride film 3. The flow rates of the $CF_4$, $CHF_3$, and $O_2$ gases are set to about 10 to 100 sccm, 10 to 300 sccm, and 10 to 70 sccm, respectively. A gas mixture of $Cl_2/Hbr$ may be used to etch the silicon substrate 1. The flow rates of the $Cl_2$ and the HBr gases are set to about 10 to 100 sccm, respectively. Further, the trenchs 6 in different devices may have different depths, since the trench depth will depend largely on the degree of the device integration In general, the trench 6 is formed to a depth of about 1000 to 3000 Å, but it should be recognized that any trench depth, even outside the range given above, is possible in the present invention.

The insulating film 7 (for a spacer) is formed by an oxide film or a nitride film but other insulating materials that are usually used in a semiconductor manufacturing process may be used instead. In particular, if a nitride film is used for the insulating film 7, it is possible to deposit an oxide film underneath the nitride film.

Figure 2C:
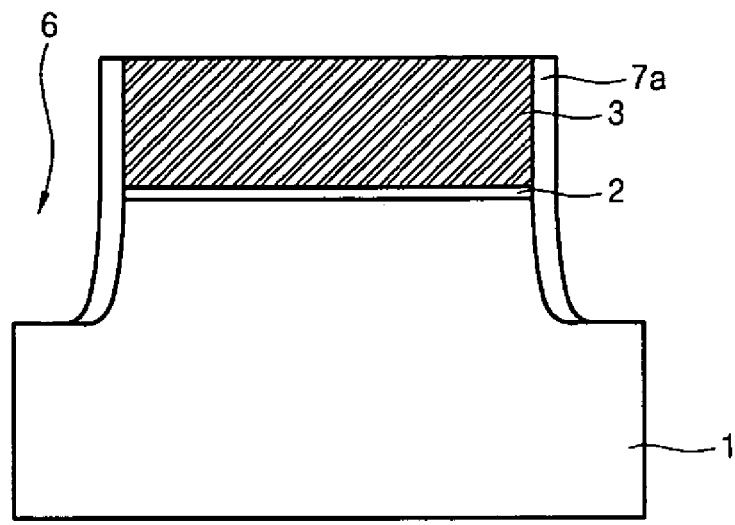

Referring to FIG. 2C, the insulating film 7 is etched to form an insulating film spacer 7a on the trench sidewalls including the exposed surfaces of the substrate 1 and the etched pad oxide and nitride films 2, 3.

The insulating film spacer 7a is then used as an etch barrier in a subsequent process of etching the silicon substrate 1 in a specific lateral direction as will be described in detail below. That is, an opening process for exposing a substrate portion of the trench bottom surface is further conducted in order to prepare subsequent wet or dry etch and oxidation processes in the manufacturing method of the present invention.

After forming the trench 6 with the lateral etching using the spacer 7a as the etch barrier, a device isolation film 13 can be formed by performing, for example, a sidewall oxidation process, a nitride deposition process, a liner oxidation process, and a trench filling-up process.

Figure 2D:
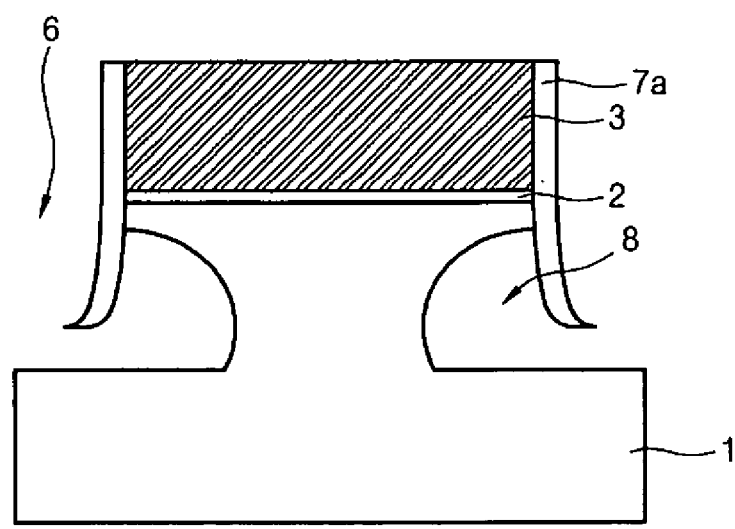

Referring to FIG. 2D, the resultant substrate shown in FIG. 2C is subjected to a heat treatment at the temperature of 800 to 1000° C. under hydrogen atmosphere to remove foreign substances on the substrate surface. Thereafter, lateral etch in a specific lateral direction toward the inner side of the insulating film spacer 7a. The silicon substrate 1 of the body region is exposed using the pad nitride film 3 and the insulating film spacer 7a as the etch barriers. In this way, a vacant space 8 is provided in the active region of the silicon substrate 1. Referring back to FIG. 1, the insulating film 10 and the conductive electrode 11a for adjusting a threshold voltage will be formed in the vacant space 8.

The lateral etching so as to provide the vacant space 8 may be performed by: a dry etch process using plasma; a wet etch process using chemicals; or a dry etch process using a gas mixture in which elements of Group VII, such as F, Cl, Br or the like, and hydrogen are contained.

For example, the lateral etch for providing the vacant space 8 may be performed using a gas mixture of HCl and $H_2$ at a temperature of 700 to 1000° C., wherein the flow rates of the HCl and $H_2$ gases are respectively set to 0.1 to 1 slm and 10 to 50 slm, so as to adjust an etch speed and an etch profile of the silicon substrate 1.

Figure 2E:
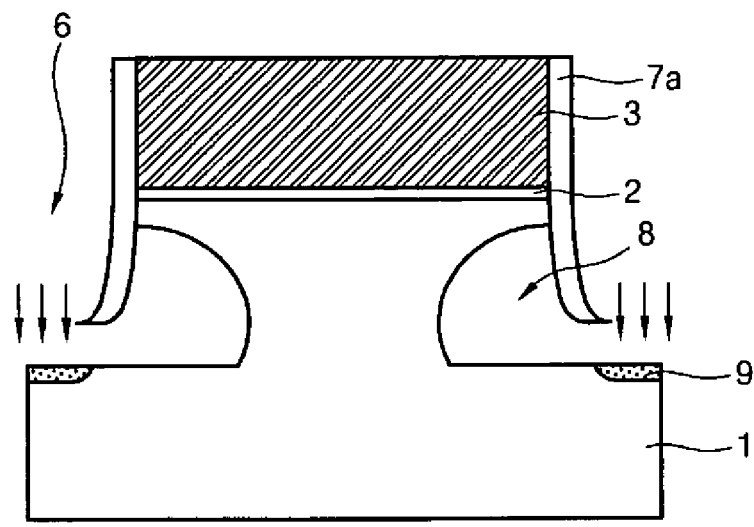

Referring to FIG. 2E, the resultant substrate is subjected to field stop implantation to form an implant layer 9 within the substrate surface of the trench bottom surface. The formation of the ion implant layer 9 is intended to prevent leakage current between cells, which may be caused by applying a voltage to the electrode material for adjusting the threshold voltage.

Figure 2F:
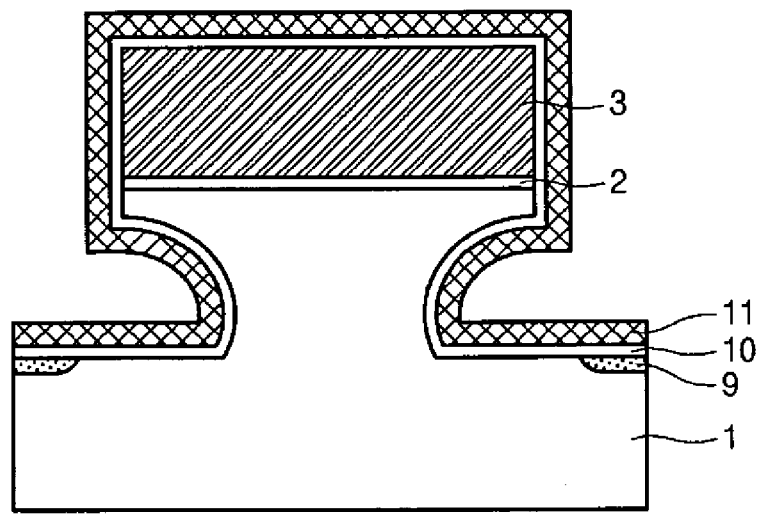

Referring to FIG. 2F, the insulating film spacer 7a is removed and then an insulating film 10 (for adjusting the threshold voltage together with the conductive electrode 11a to be formed later) is deposited on the resultant substrate. The insulating film 10 may be any insulating film material such as SiO$_2$, NO, ONO and HfO films, that are also usually used as the gate oxide material.

Next, an electrode material film 11 for applying an external voltage is deposited on the insulating film 10. Doped polysilicon is preferably used as the electrode material film 11, but it is possible to use metal such as Al, Cu, etc., other than the polysilicon.

Figure 2G:
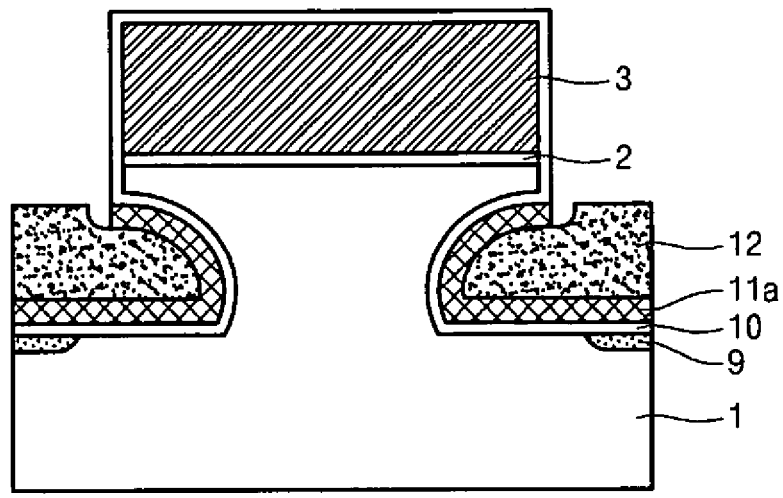

Referring to FIG. 2G, in order to remove the electrode material film around the active region of the silicon substrate 1, the resultant substrate is coated with a photoresist film 12. The photoresist film 12 is then etched-back so that the photoresist film 12 is left only in the lateral-etched region of the the vacant space 8. Thereafter, an exposed portion of the electrode material film 11 is removed by a wet or dry etch technique using the remaining photoresist film 12 as the etch barrier. In this manner, the conductive electrode 11a, which is used to externally apply a voltage to the body region, is formed.

Here, the electrode material film 11 may be etched using a gas mixture of Cl$_2$/HBr, wherein the flow rates of the Cl$_2$ and HBr gases are set to 10 to 100 sccm, respectively. The electrode material film 11 may also be etched using a solution mixture of acetic acid, nitric acid, and NH$_3$OH.

Although the photoresist film 12 is used as the etch barrier material for the removal of the electrode material film 11 around the substrate active region in this embodiment, it is possible to use an oxide film such as SOG, HTO, LTO, thermal oxide, and/or BPGS films instead of the photoresist film.

Figure 2H:
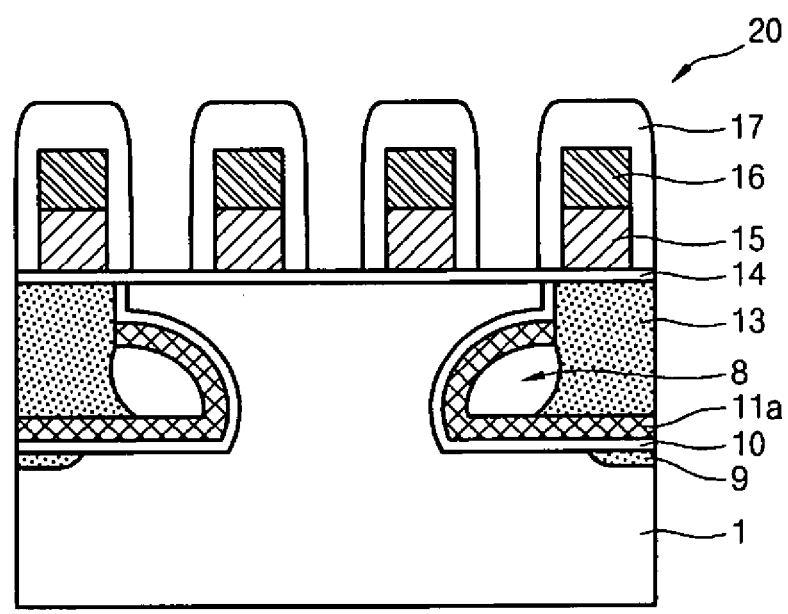

Referring to FIG. 2H, the remaining photoresist film 12 is removed by a stripping process, and the STI process is followed to form the device isolation film 13. In the process of filling up the trench with an oxide film or other suitable materials to form the device isolation film 13, voids may be formed in the laterally etched portion 8 of the trench due to the structural peculiarity, but the voids, even if they are present, will not influence the adjustment of the threshold voltage.

Next, a gate 20 is formed on the silicon substrate 1. Here, it should be known that the gate 20 has a multi-layer structure of a gate oxide film 14, a gate conductive film 15 and a hard mask film 16 as shown in FIGS. 1 and 2H. The gate 20 is also provided with a gate spacer 17. Thereafter, junction regions (not shown) are formed on the substrate surface at both side of the gate 20. In this manner, the MOSFET is constructed.

Subsequently, a series of well-known DRAM manufacturing processes can be performed to complete the semiconductor device.

As described above in respect of an embodiment of the present invention, a partial SOI structure is realized within the silicon substrate 1 by forming the insulating film 10 (and the conductive electrode 11a) in the laterally vacant space 8 as shown in FIGS. 1 and 2H. The potential of the substrate body region can be easily adjusted by applying an external voltage to the separate conductive electrode 11a. As a result of this, the threshold voltage is easily adjustable to obtain a desired value.

Accordingly, the electromagnetic fields in the junction and channel regions are reduced since the threshold voltage is adjustable by an external voltage without impurity implantation. This remarkably enhances the DRAM refresh characteristics and allows to realize high-speed and low-voltage operations of the device.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor device having a silicon substrate having an active region between two device isolation films and a gate formed on the surface of the active region, the semiconductor device having a threshold voltage that can be adjusted by the application of an external voltage to the substrate, the semiconductor device being comprised of:

an unwardly extending silicon substrate having sides into which there are formed laterally etched void portions in the active region below the surface of the active region on the sides near the device isolation film;

an insulating film formed on the laterally etched void portions of the silicon substrate;

a conductive electrode formed on the insulating film, the conductive electrode being sized, shaped and arranged to adjust a threshold voltage of the semiconductor device when a voltage is applied to said conductive electrode; and a device isolation film applied on the conductive electrode, the device isolation film defining a cavity within the laterally etched void portions between the device isolation film and the conductive electrode.

2. The semiconductor device of claim 1, further comprising a field stop implantation layer formed in the substrate underneath the insulating film outside the active region.

3. A semiconductor device having a silicon substrate having an active region between two device isolation films and a gate formed on the surface of the active region, the semiconductor device having a threshold voltage that can be adjusted by the application of an external voltage to the substrate, the semiconductor device being comprised of:

an upwardly extending silicon substrate having sides into which there are formed laterally etched portions in the active region below the surface of the active region on the sides near the device isolation film;

an insulating film formed on the laterally etched portion of the silicon substrate;

a conductive electrode means for adjusting a threshold voltage of the semiconductor device when a voltage is applied to said conductive electrode means, said conductive electrode means being formed on the insulating film; and an isolation film applied on the conductive electrode, the device isolation film defining a cavity within the laterally etched portions between the device isolation film and the conductive electrode.

* * * * *